United States Patent [19]

Strauss

[11] Patent Number: 5,719,449
[45] Date of Patent: Feb. 17, 1998

[54] FLIP-CHIP INTEGRATED CIRCUIT WITH IMPROVED TESTABILITY

[75] Inventor: Mark Steven Strauss, Allentown, Pa.

[73] Assignee: Lucent Technologies Inc., Murray Hill, N.J.

[21] Appl. No.: 724,129

[22] Filed: Sep. 30, 1996

[51] Int. Cl.$^6$ .......................... H01L 23/48; H01L 23/52; H01L 29/40

[52] U.S. Cl. ......................................... 257/786; 257/776

[58] Field of Search ..................... 257/786, 776, 257/780, 781; 437/180, 183, 187, 189, 204

[56] References Cited

U.S. PATENT DOCUMENTS

| | | | |
|---|---|---|---|
| 4,488,267 | 12/1984 | Harrison | 365/201 |
| 5,206,585 | 4/1993 | Chang et al. | 324/158 P |
| 5,212,406 | 5/1993 | Reele et al. | |
| 5,334,857 | 8/1994 | Mennitt et al. | |
| 5,594,273 | 1/1997 | Dasse et al. | |

OTHER PUBLICATIONS

T.D. Dudderar et al.,"AT&TµSurface Mount Assembly: A New Technology for the Large Volume Fabrication of Cost Effective Flip–Chip MCMs", *Proceedings of the 1994 International Conference on Multichip Modules, sponsored by IEEE*, Apr. 13–15, 1994, Denver, Colorado, pp. 266–272.

Joel Darnauer et al., "Fast Pad Redistribution from Periphery–IO to Area–IO", *1994 IEEE Multi–Chip Module Conference MCMC–94*, Mar. 15–17, 1994, Santa Cruz, California, pp. 38–43.

Ray–Long Day et al.i, "A Silicon–on–Silicon Multichip Module Technology with Integrated Bipolar Components in the Substrate", *1994 IEEE Multi–Chip Module Conference MCMC–94*,Mar. 15–17, 1994, Santa Cruz, California, pp. 64–67.

Primary Examiner—Mahshid D. Saadat
Assistant Examiner—S. V. Clark
Attorney, Agent, or Firm—James H. Fox

[57] ABSTRACT

An integrated circuit is adapted for implementing flip-chip technology with solder bumps, while providing for improved testability. The integrated circuit comprises two sets of pads formed in the same metal layer, with a first set being used for wafer probing, and a second set for solder bumps. The wafer probe pads are placed in one row along each chip edge. A second set of pads, the solder bump pads, are arranged in rows towards the center of the chip with respect to the wafer probe pads. Metal interconnects formed in the same metal layer as the pads connects each solder bump pad to a corresponding wafer probe pad. Testing of the integrated circuit may be accomplished using the wafer probe pads according to conventional techniques, while mounting of the chip may be accomplished with the solder bump pads using the flip-chip technology.

23 Claims, 3 Drawing Sheets

FLIP-CHIP INTEGRATED CIRCUIT WITH IMPROVED TESTABILITY

BACKGROUND OF THE INVENTION

1. Field of the Invention

The present invention relates to testing integrated circuits (ICs) that are adapted for flip-chip mounting.

2. Description of the Prior Art

Integrated circuits have increasingly required a higher number of interconnects for connection to external circuitry, including signal inputs and outputs, and power supply connections. The higher number has usually been in the form of an increased number of wire bonding pads ("bondpads") around the periphery of an IC chip. This has often been obtained as the size of IC chips increases, providing for an increased peripheral area, and also as the density of bondpads has increased, due to a smaller size per bondpad. In addition, a need exists for increased performance in some cases, whereby a reduction in conductor inductance and/or capacitance is required. Either or both of these requirements has led to increasing adoption of "flip-chip" technology, wherein "solder bumps" are formed on metal pads, and the pads then soldered directly to a mounting substrate. The pads may then be more readily located in the interior of the chip, as well as the periphery, allowing for a greater number of interconnects for a given chip area.

Problems arise when testing a chip on which solder bumps have been formed. The traditional technique of testing is to use a multiplicity of semi-rigid wire probes that are pressed onto the metal (e.g., aluminum) chip bondpads to make electrical contact thereto. Then, input/output signals and power supply voltages may be supplied to the chip being tested. This is referred to as "wafer probing", since the IC chips are still attached to one another on a wafer, which is thereafter sawed apart to form the individual chips. In addition, attempting to apply test probes to solder bumps formed on the bondpads may be difficult, since the relatively soft solder could in some instances cause the probes to stick to the solder bumps. Furthermore, there may be more than one row of solder bumps along each edge of the chip. Each row has a different offset from the chip edge, which make them difficult to probe reliably with cantilever probes.

One attempt to circumvent these problems has been to test the chip first using a conventional wafer probing technique on wire bonding pads located along the edges of a chip. Thereafter, an insulating layer (e.g., polyimide) is deposited on the wafer and another level of metal deposited and patterned to form solder bump pads that are connected to the corresponding wire bonding pads through openings formed in the insulating layer. The solder bump pads then have solder bumps formed thereon, and the chip is then mounted on a substrate using flip-chip technology. This approach is described in "AT&T µ Surface Mount Assembly: A New Technology for the Large Volume Fabrication of Cost Effective Flip-Chip MCMs", by T. D. Dudderar et al in *Proceedings of the 1994 International Conference on Multichip Modules*, pages 266–272 (1994).

SUMMARY OF THE INVENTION

I have invented an integrated circuit that is adapted for ease of testing while still providing for solder bumps, and a method of testing using the improved integrated circuit. The integrated circuit comprises two sets of pads formed in the same metal layer, with a first set being used for wafer probing, and a second set for solder bumps. The wafer probe pads are placed along each chip edge. A second set of pads, the solder bump pads, are arranged in rows towards the interior of the chip with respect to the wafer probe pads. Metal conductors connect each solder bump pad to a corresponding wafer probe pad. Testing of the integrated circuit may be accomplished using the wafer probe pads according to conventional techniques, while mounting of the chip may be accomplished with the solder bump pads using the flip-chip technology.

DETAILED DESCRIPTION

Figure 1:
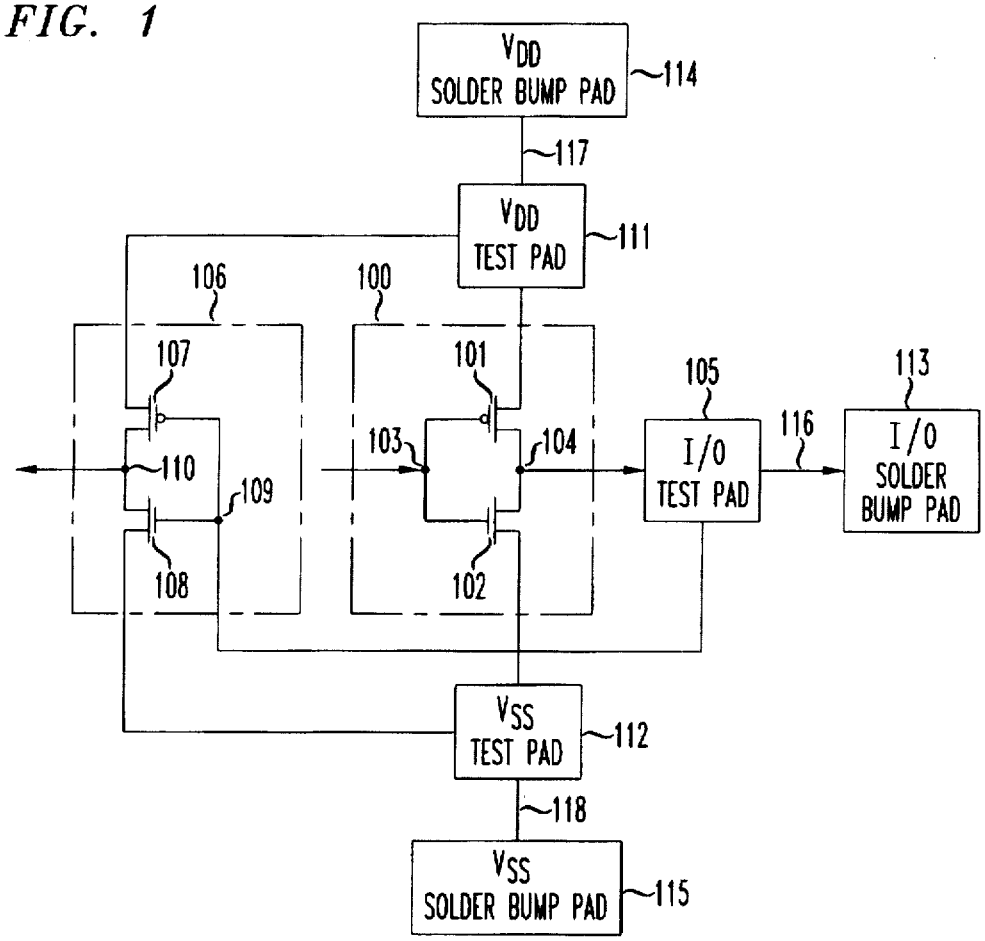
FIG. 1 shows typical prior-art input/output circuitry and associated signal and power bondpads.

The following detailed description relates to an integrated circuit that is adapted to implement flip-chip technology with improved testability, and a method of testing it. A typical application of the inventive technique is for supplying input and output signals and power supply voltages to an integrated circuit. For example, referring to FIG. 1, an output buffer 100 that includes CMOS transistors 101 and 102 has an output node 104 that is connected to an I/O test pad 105, which is then connected to an I/O solder bump pad 113 by conductor 116. Similarly, an input buffer 106 that includes CMOS transistors 107 and 108 has an input node 109 connected to the test pad 105, and thence to solder bump pad 113. Also, note that the power supply voltages $V_{DD}$ is supplied to the buffers via solder bump pad 114, conductor 117, and test pad 111, whereas $V_{SS}$ is supplied via solder bump pad 115, conductor 118 and test pad 112. The test pads may be formed in same location as conventional bondpads around the periphery of the IC, as more fully explained below. The solder bump pads may then be formed in the interior of the IC if desired.

Figure 2:
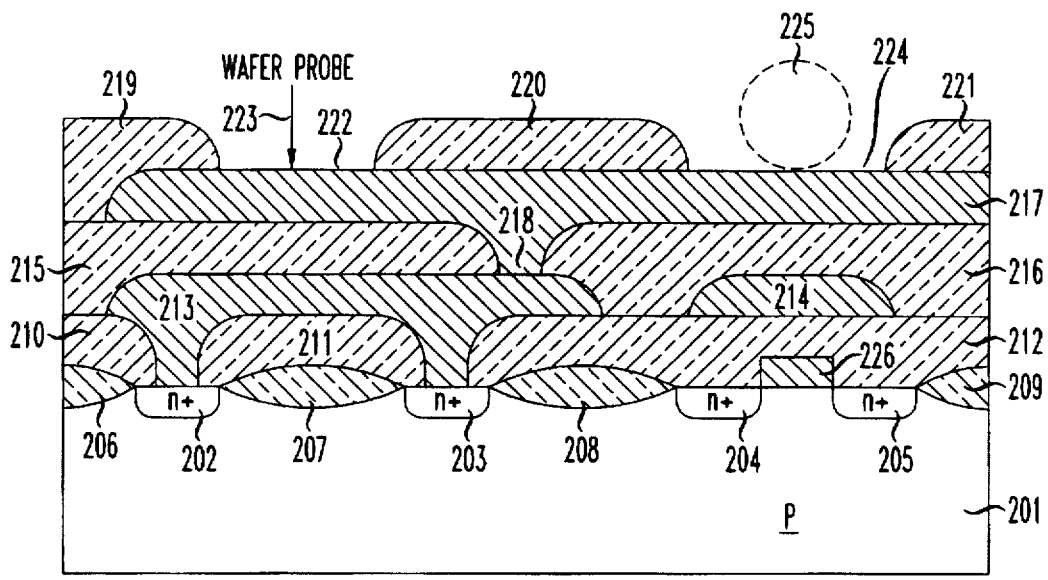
FIG. 2 shows an illustrative embodiment of the locations of wafer probe pads and solder bump pads on a chip, and representative ones of the interconnections therebetween.

Referring to FIG. 2, a cross-section of an illustrative IC that embodies the invention is shown. A semiconductor substrate 201, being p-type in the illustrative case, has formed therein doped (n+) contact regions 202 and 203. The contact regions connect by conductors (not shown for clarity) to the drain 204, or gate 226, or source 205 of a transistor, which may be an input device or an output device as appropriate, as indicated in FIG. 1. Contact is made to the regions 202 and 203 by means of first metal (e.g., aluminum) layer 213 through window openings in the dielectric (e.g., boro-phosphosilicate glass) layer designated as 210, 211 and 212. This first metal layer is in turn contacted by a second metal layer 217 through a via opening 218 located in the dielectric (e.g., boro-phospho tetraethylorthosilicate) layer designated as 215 and 216. This second metal layer has formed thereon a dielectric (e.g., silicon nitride) cap layer designated as 219, 220 and 221. Openings as shown in the cap layer allow access to the metal layer 217, providing for a test pad 222, and also for a solder bump pad 224 that may have formed thereon a solder bump 225. The test pad may be used in testing the IC by means of wafer probe 223, whereas the solder bump pad 224 and solder bump 225 may be used for flip-chip mounting of the IC, according to techniques known in the art.

It can be seen that in the illustrative embodiment, the test pad, solder bump pad, and the conductor that forms the connection therebetween are formed in the same metal layer. Alternatively, the conductor that forms the connection may be located in a different metal layer than the metal layer in which the pads are formed, and connected thereto through vias according to techniques known in the art. Although a two-level metal case is shown illustratively in FIG. 2, the inventive technique may be used with IC's having additional metal levels. For example, in one commercial CMOS process implemented in 0.35 micron technology, four metal levels are used, with the test pad and solder bump pad being formed in the top (e.g. fourth) metal level.

Figure 3:
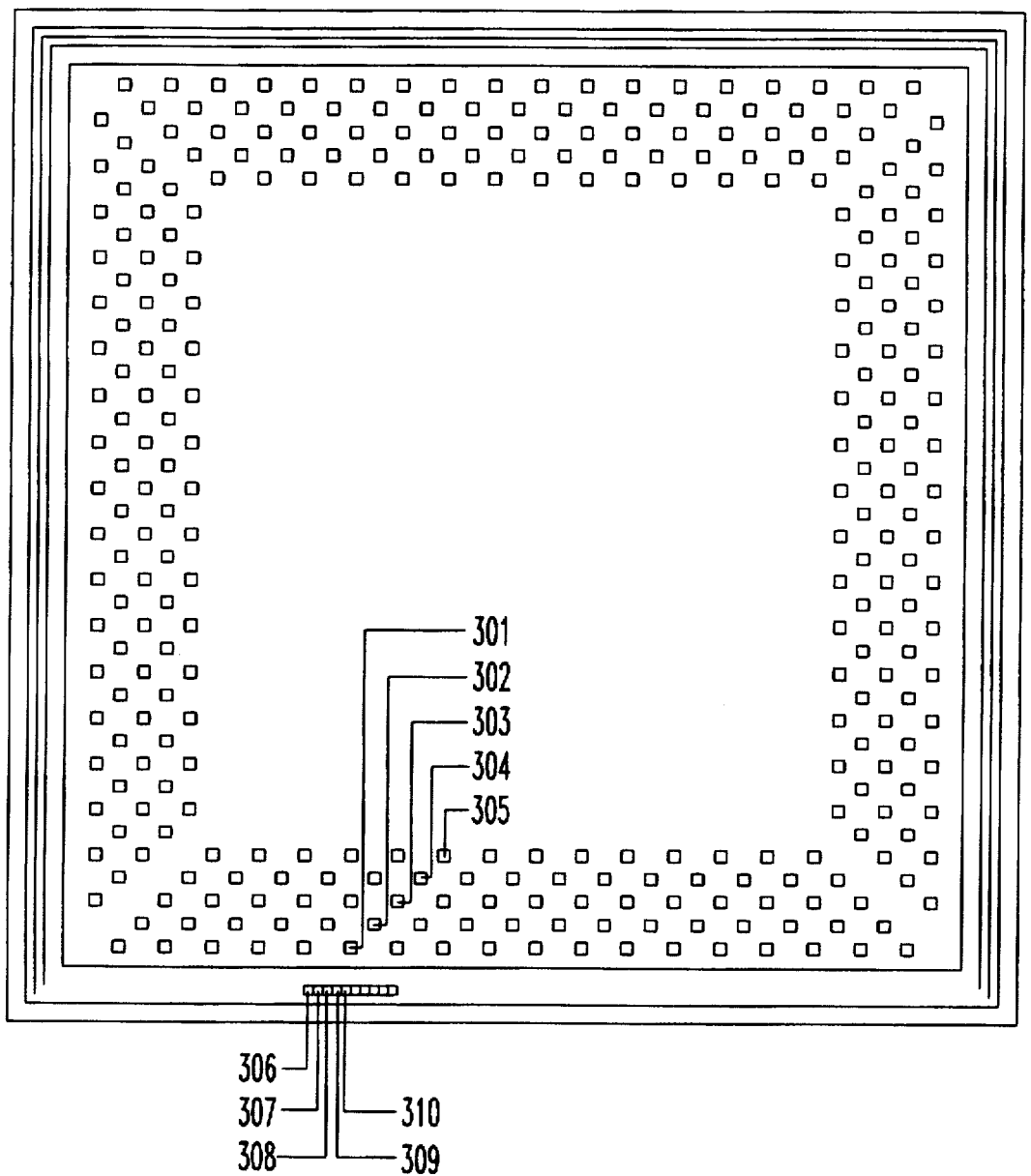
FIGS. 3 and 4 show a cross-section of an integrated circuit that implements the invention.

Referring to FIG. 3, a top view of an illustrative IC that implements the invention is shown. The solder pads are arranged in rows around the periphery of the IC, with five rows shown in the illustrative case. Illustrative solder pads are labeled as 301, 302, 303, 304, and 305, with one illustrative pad per row. These solder pads allow for a solder bump (not shown) to be applied thereto, so that the IC may be flip-chip mounted to a mounting substrate according to techniques known in the art. In addition to the solder pads, the present invention provides for test pads connected to the solder pads. The test pads are typically located along the edges of the IC in locations comparable to the conventional wire bonding pads of prior-art ICs. For example, the illustrative test pads 306–310 are located along the lower edge of the IC (as viewed), and are electrically connected to the corresponding solder pads 301–305, respectively, by means of conductors not shown for clarity. It can be seen that the test pads then provide for the application of test probes to the IC in a conventional manner, so that the IC can be tested prior to mounting.

Figure 4:
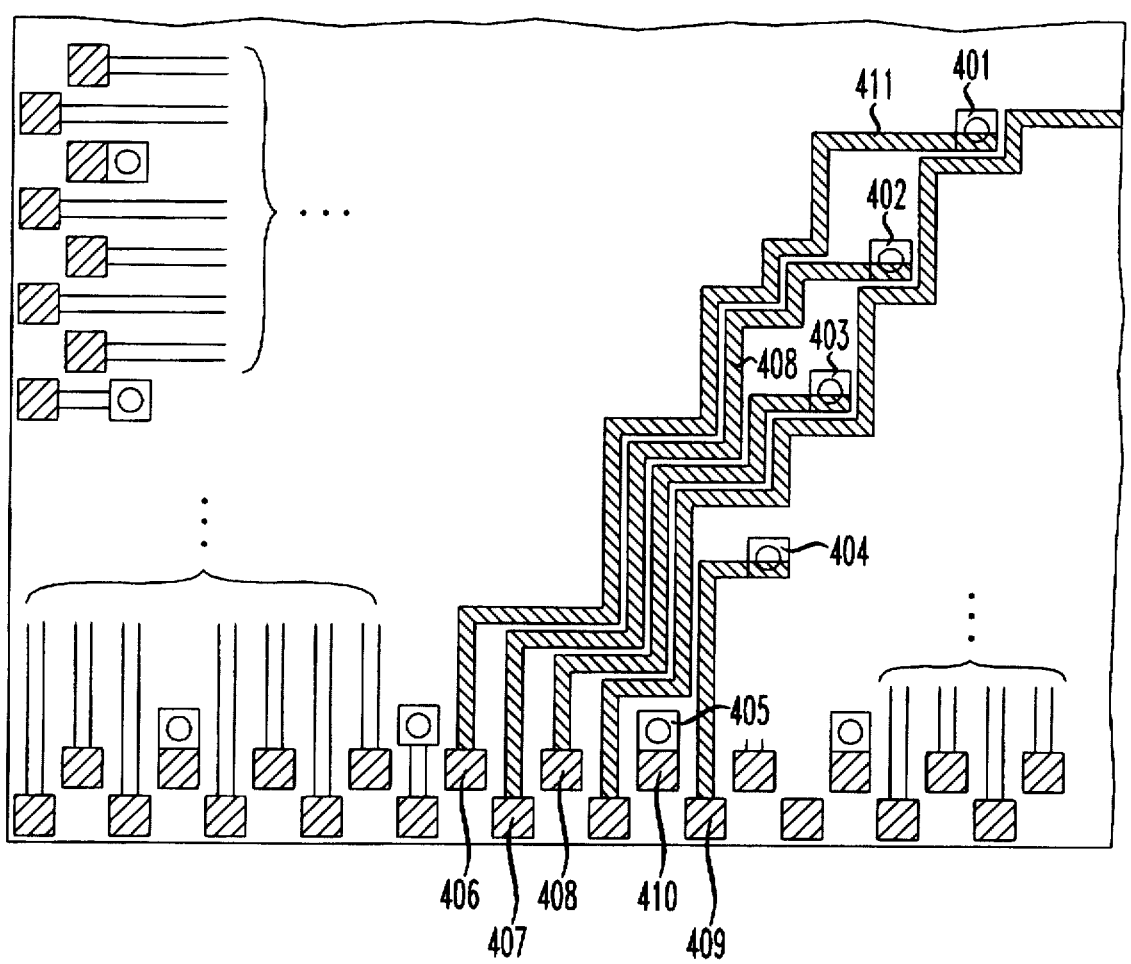

The conductors that connect the solder pads and the test pads are shown illustratively in the corners of the IC in FIG. 4. For example, the solder pad 401 is connected to the test pad 406 by means of conductor 411. Similarly, solder pad 402 is connected to the test pad 407 by means of conductor 408, and so forth for the other pads shown. It can be seen that the test pads may be staggered along the edge of the IC chip in order to improve linear density. In contrast to various of the prior-art techniques, the solder pads and test pads are formed in the same conductor (e.g., metal) level. In addition, the metal conductors that connect the solder pads and the test pads may be formed in this same conductor level, if desired. This allows for improved ease of fabrication, since the same metal level that otherwise would form the conventional wire bonding pads can also be used to form the test pads and solder bump pads. In addition, testing of the IC is improved, since the wafer probe testing can be accomplished after all of the metal layers are deposited, and even after the solder bumps are applied if desired. This contrasts with certain prior-art techniques that tested the IC before all of the metallization steps were accomplished. However, such prior-art techniques leave open the possibility that defects could be introduced by such additional operations, and furthermore remain undetected, until after the IC chip was mounted on a mounting substrate, when repair is more difficult.

Numerous other embodiments of the invention are possible, as will be apparent to a person of skill in the art.

The invention claimed is:

1. An integrated circuit comprising devices formed in a semiconductor substrate, and a first set of metal pads formed in a given metal layer overlying said substrate and adapted to provide solder bump connections to external circuitry, characterized in that said integrated circuit further comprises a second set of metal pads also formed in said given metal layer and adapted to being contacted by test probes;

and wherein pads in said first set are connected to corresponding pads in said second set by means of conductors;

and wherein the pads in said second set contact devices formed in said semiconductor substrate through openings in at least one dielectric layer overlying said substrate.

2. The invention of claim 1 wherein said conductors are also formed in said given metal layer.

3. The invention of claim 1 wherein the pads in said first set are located interior to the pads of said second set with respect to the boundaries of said integrated circuit.

4. The invention of claim 1 wherein the pads in said second set are located along the edges of said integrated circuit.

5. The invention of claim 1 wherein some of said pads are adapted to provide power supply voltages to said integrated circuit.

6. The invention of claim 1 wherein some of said pads are connected to signal input circuitry on said integrated circuit.

7. The invention of claim 1 wherein some of said pads are connected to signal output circuitry on said integrated circuit.

8. An integrated circuit comprising devices formed in a semiconductor substrate, and a first set of metal pads formed in a given metal layer overlying said substrate, with said pads being adapted to provide solder bump connections to external circuitry, characterized in that said integrated circuit further comprises a second set of metal pads also formed in said given metal layer and adapted to being contacted by test probes;

and wherein pads in said first set are connected to corresponding pads in said second set by means of conductors formed in said given metal layer;

and wherein the pads in said second set contact devices formed in said semiconductor substrate through openings in at least one dielectric layer overlying said substrate;

wherein the pads in said first set are located interior to the pads of said second set with respect to the boundaries of said integrated circuit, and wherein the pads in said second set are located along the edges of said integrated circuit;

wherein some of said pads are adapted to provide power supply voltages to said integrated circuit, some of said pads are connected to signal input circuitry on said integrated circuit, and some of said pads are connected to signal output circuitry on said integrated circuit.

9. A method of testing an integrated circuit having devices formed in a semiconductor substrate by steps comprising applying test probes to a first set of metal pads formed in a given metal layer and located around the periphery of the integrated circuit, characterized in that said integrated circuit comprises a second set of metal pads formed in said given metal layer overlying said substrate, with said pads being adapted to provide solder bump connections to external circuitry, and wherein pads in said first set are connected to corresponding pads in said second set by means of conductors;

and wherein the pads in said first set contact devices formed in said semiconductor substrate through openings in at least one dielectric layer overlying said substrate.

10. The invention of claim 9 wherein said conductors are also formed in said given metal layer.

11. The invention of claim 9 wherein the pads in said second set are located interior to the pads of said first set with respect to the boundaries of said integrated circuit.

12. The invention of claim 9 wherein the pads in said first set are located along the edges of said integrated circuit.

13. The invention of claim 9 wherein some of said pads are adapted to provide power supply voltages to said integrated circuit.

14. The invention of claim 9 wherein some of said pads are connected to signal input circuitry on said integrated circuit.

15. The invention of claim 9 wherein some of said pads are connected to signal output circuitry on said integrated circuit.

16. A method of mounting an integrated circuit having devices formed in a semiconductor substrate by steps comprising applying solder bumps to a first set of metal pads formed in a given metal layer, characterized in that said integrated circuit comprises a second set of metal pads formed in said given metal layer overlying said substrate with said pads, being adapted to being contacted by test probes, and wherein pads in said first set are connected to corresponding pads in said second set by means of conductors;

and wherein the pads in said second set contact devices formed in said semiconductor substrate through openings in at least one dielectric layer overlying said substrate.

17. The invention of claim 16 wherein said conductors are also formed in said given metal layer.

18. The invention of claim 16 wherein the pads in said first set are located interior to the pads of said second set with respect to the boundaries of said integrated circuit.

19. The invention of claim 16 wherein the pads in said second set are located along the edges of said integrated circuit.

20. The invention of claim 16 wherein some of said pads are adapted to provide power supply voltages to said integrated circuit.

21. The invention of claim 16 wherein some of said pads are connected to signal input circuitry on said integrated circuit.

22. The invention of claim 16 wherein some of said pads are connected to signal output circuitry on said integrated circuit.

23. The invention of claim 16 further comprising the step of flip-chip bonding said integrated circuit to a mounting substrate.

* * * * *